Dec. 2, 1969 H. D. MARSHALL 3,482,114
ELECTRONIC SHIFT REGISTER UTILIZING A SEMICONDUCTOR
SWITCH, SILICON-CONTROLLED RECTIFIERS, AND
CAPACITORS FOR SEQUENCING OPERATION
Filed April 6, 1966
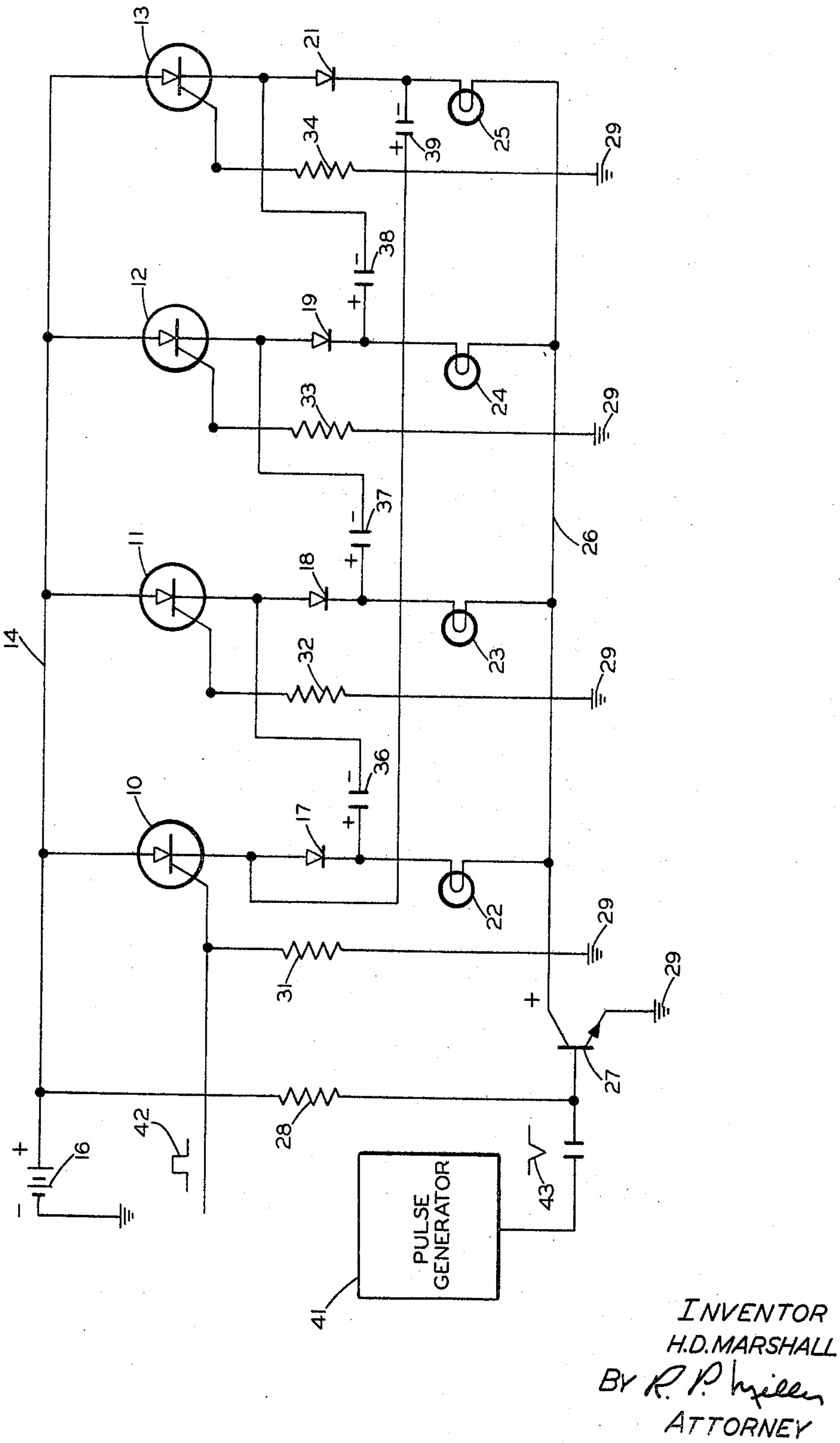
INVENTOR
H.D. MARSHALL
BY R. P. Miller
ATTORNEY United States Patent Office 3,482,114

Patented Dec. 2, 1969

3,482,114

ELECTRONIC SHIFT REGISTER UTILIZING A SEMICONDUCTOR SWITCH, SILICON-CONTROLLED RECTIFIERS, AND CAPACITORS FOR SEQUENCING OPERATION

Howard D. Marshall, Stroudsburg, Pa., assignor to Western Electric Company, Incorporated, New York, N.Y., a corporation of New York Filed Apr. 6, 1966, Ser. No. 540,740

Int. Cl. H03k 21/00, 23/22

U.S. Cl. 307—221 5 Claims

ABSTRACT OF THE DISCLOSURE

A shift register includes a series of sequentially operated silicon-controlled rectifiers each having an associated coupling capacitor connecting to the next succeeding rectifier. During a period of conduction of a rectifier the associated coupling capacitor is charged. A short pulse applied to a conducting transistor switch renders the switch non-conductive to render the conducting rectifier non-conductive and isolate the charged capacitor. The termination of the pulse renders the transistor switch conductive to discharge the capacitor thereby rendering the switch and the next succeeding rectifier conductive.

This invention relates to an electronic shift register and, more particularly, to an electronic shift register having a series of sequentially operated silicon-controlled rectifiers wherein a coupling capacitor is charged during the conductive cycle of an associated silicon-controlled rectifier and is subsequently discharged to actuate a succeeding associated silicon-controlled rectifier.

An electronic shift register contemplates a network comprising a plurality of tandem connected circuit stages each of which has more than one state of stability. A characteristic of this type of network is the ability of having one stage in a first predetermined state of stability while the remaining stages are maintained in a second predetermined state of stability. The first predetermined stability state of the one stage is successively advanced through the succeeding stages. Circuits of this type are used in electric counters, computers, frequency dividers, telegraph or other type distributors, etc.

It is an object of this invention to provide a new and improved electronic shift register.

Another object of this invention is to provide an electronic shift register having a series of sequentially operated silicon-controlled rectifiers wherein a coupling capacitor is charged during the conductive cycle of an associated silicon-controlled rectifier and is subsequently discharged to actuate a succeeding associated silicon-controlled rectifier.

It is a further object of this invention to provide an electronic shift register having a series of sequentially operated silicon-controlled rectifiers wherein a capacitor is charged when both its associated silicon-controlled rectifier and a transistor switch are conductive, is isolated during the non-conductive cycle of the transistor switch, and is subsequently discharged when the transistor switch is rendered conductive to actuate a succeeding silicon-controlled rectifier.

A further object of the invention resides in a multi-stage stepping circuit having a capacitance coupling between stages which is charged during operation of one stage and which is rendered effective to apply a positive potential to control an input circuit and a negative potential to control the operation of the next succeeding stage.

With these and other objects in view, the present invention contemplates a shift register having a series of sequentially operated silicon-controlled rectifiers. Each silicon-controlled rectifier has an associated capacitor which is charged when its silicon-controlled rectifier is conductive. Pulses of short duration are periodically applied to operate an electronic switch and render each silicon-controlled rectifier non-conductive, thereby isolating the charge on its associated capacitor. At the termination of each pulse, the electronic switch reverts to its original condition and the charged capacitor is discharged to actuate the succeeding silicon-controlled rectifier.

These and other objects, aspects and advantages of this invention may be appreciated from the following detailed description and from the accompanying drawing which shows a schematic circuit diagram of multi-stage silicon rectifier circuit connected as a ring counter in accordance with the principles of the invention.

Referring to the figure, there is shown a multi-stage electronic shift register or ring counter wherein each stage includes a silicon-controlled rectifier, a diode and an output device or indicating lamp. These silicon-controlled rectifiers 10, 11, 12 and 13 have an anode, a cathode and a control electrode which initiates the flow of current between the anode and cathode. Once conduction is established, the control electrode loses control, and the rectifier may only be rendered non-conductive by lowering its anode potential or raising its cathode potential.

The anodes of these silicon-controlled rectifiers are connected to a common lead 14 running to a source of a positive potential 16. The cathodes of the silicon-controlled rectifiers are connected through respective non-linear resistor elements or diodes 17, 18, 19 and 21, which are connected in the forward direction, to respective output devices, such as resistive indicating lamps 22, 23, 24 and 25 connected to a common lead 26. This common lead 26 is connected to a collector of a normally conductive NPN transistor switch 27. The positive potential source 16 is also applied through a resistor 28 to bias the base of the transistor switch 27, while a source of ground potential 29 is connected to the emitter. Ground potential source 29 is also applied to the control electrode of the silicon-controlled rectifiers 10, 11, 12 and 13 through respective resistors 31, 32, 33 and 34.

Each stage of the electronic shift register has an associated capacitor 36, 37, 38 and 39 coupling that stage to a succeeding stage. Each capacitor has one plate connected to the cathode of the respective diodes 17, 18, 19 and 21 while the other plate is connected to the anode of respective diodes 18, 19, 21 and 17.

A pulse generator 41 is capacitively coupled to the base of the transistor switch 27. This pulse generator 41 may be operated to periodically apply negative pulses 43 of short duration to the base of the transistor switch 27 to render the transistor 27 nonconductive for the duration of the pulse.

Considering now the operation of the electronic shift register, a positive initiating pulse 42 is applied to the control electrode of one of the silicon-controlled rectifiers, such as the control electrode of the silicon-controlled rectifier 10 to render that rectifier conductive.

Current flows from the power source 16 through the now conductive silicon-controlled rectifier 10, the diode 17, the output device 22, the common lead 26, and the normally conductive transistor switch 27 to the ground 29. This current operates the output device 22.

A momentary charging current also flows from the power source 16 through the now conducting silicon-controlled rectifier 10, the diode 17, the capacitor 36, the diode 18 and the output device 23 of the succeeding stage, the common lead 26, and the conductive transistor switch 27 to the ground 29. This momentary current charges the capacitor 36.

Pulse generator 41 is then operated to apply a negative pulse 43 of short duration to the base of the normally conductive transistor switch 27 to render this switch nonconductive. The interruption of the switch 27 disrupts the ground 29 thereby interrupting the flow of current through the silicon-controlled rectifier 10 to render the rectifier 10 nonconductive. However, capacitor 36 retains its charge because the removal of the ground 29 disables its discharge path.

Upon the expiration of the negative pulse 43 of short duration, the base of the normally conductive transistor switch 27 returns to its normal positive potential established by the source of positive potential 16 through the resistor 28. The positive potential on the positive plate of the charged capacitor 36 is applied to the collector of the transistor switch 27 to render the switch 27 conductive. Simultaneously, the negative potential on the negative plate of the capacitor 36 is applied to the cathode of the succeeding silicon-controlled rectifier 11. Since the source of ground potential 29 is also applied to the control electrode of the rectifier 11 through the resistor 32, the silicon-controlled rectifier 11 is rendered conductive. Capacitor 36 is thus discharged through the output device 22, the common lead 26, the transistor switch 27, the ground 29, the resistor 32 and the control electrode and cathode of the succeeding silicon-controlled rectifier 11. The conduction of the silicon-controlled rectifier 11 operates its output device 23. The circuit is now in condition for stepping to the next silicon rectifier upon impression of the next pulse on the base of transistor 27.

It is understood that the above-described arrangements of circuits and construction of elemental components are simply illustrative of an application of the principles of the invention and many other modifications may be made without departing from the invention.

I claim:

1. In a multi-stage counting circuit wherein each stage includes a silicon-controlled rectifier having an anode, a cathode, and a control electrode,
- a transistor having a collector connected to the cathodes of said silicon-controlled rectifiers,
- means for applying biasing potential to all said anodes and control electrodes of said silicon-controlled rectifiers and to the base and emitter of said transistor,
- means for rendering one of said silicon-controlled rectifiers conductive to initiate conduction of said transistor,
- a capacitance circuit interconnecting each cathode of a silicon-controlled rectifier with the cathode of the next succeeding silicon-controlled rectifier for accumulating a charge upon conduction of a silicon-controlled rectifier, and
- means for applying a momentary pulse to the base of said transistor to interrupt operation of said transistor and said conducting silicon-controlled rectifier to isolate said charged capacitor whereafter said capacitance circuit is rendered effective to bias the collector of said transistor and the cathode of the next succeeding silicon-controlled rectifier to render conductive said transistor and said next succeeding silicon-controlled rectifier.

2. In a multi-stage counting circuit as defined in claim 1, wherein said transistor is of the NPN type, and each of said capacitance circuits include a capacitor having a positively charged plate connected to said collector and a negatively charged plate connected to the cathode of the next succeeding silicon-controlled rectifier during conduction of the associated rectifier and isolation of said capacitor.

3. In a shift register,
- a series of electronic devices, each having first and second electrodes for establishing a conductive path thereacross the device, and a control electrode which initiates establishment of a conductive path and then relinquishes control of said conductive path,
- a series of capacitors, each having terminals individually coupled between the first electrode of each electronic device and the first electrode of the next succeeding electronic device,
- means for applying operating potential to said second electrodes,
- a transitor means including a base and a collector, said collector being connected in series to said first electrodes of said devices and to both terminals of the capacitors,
- means for biasing said transistor toward a conductive state to apply operating potential to said first electrodes,
- means for applying potential to one of said control electrodes to initiate conduction of the associated electronic device and the transistor and for charging the capacitor associated with that device and the next succeeding device, and
- means for applying a control pulse to said base to shut off said transistor whereupon said conducting electronic device is rendered non-conductive and following termination of said pulse the capacitor discharges to initiate conduction of both the transistor and the next succeeding device.

4. In a shift register,
- a series of electronic devices each having three electrodes, a first electrode initiating conduction between a second and a third electrode of each of said devices,
- a series of capacitors each having first and second terminal plates interconnecting a second electrode of one electronic device with a second electrode of the next succeeding device,
- a three electrode switching device having one electrode connected to all the second electrodes of said series of electronic devices,
- means for biasing said switching device into conduction,
- means including a power supply connected to said third electrodes of said electronic devices for biasing said series of electronic devices and placing one of said electronic devices in a conductive state to establish a charging circuit through said conducting electronic device, through the capacitor interconnected to the next succeeding electronic device, and through the now conducting switching device, and
- means for momentarily interrupting the operation of said switching means to interrupt operation of the conducting electronic device to isolate the charged capacitor whereafter the switching device is rendered conductive by the charge on said first plate of the capacitor and the second electrode of the next succeeding electronic device is rendered conductive by the charge on the second plate of the capacitor.

5. In a shift register as set forth in claim 4, wherein:
- each of said electronic devices is a silicon-controlled rectifier having a cathode as said second electrode an anode as said third electrode and in which said first electrode is a control electrode,
- said three electrode switching device is a transistor having at least a base and a collector, said collector being connected in series to said control electrodes of said silicon-controlled rectifiers and to both terminal plates of each of the capacitors, said base being connected to said interrupting means, and each of said capacitors has one terminal plate connected to the conducting electronic device accumulating a positive charge and another plate connected to the succeeding electronic device accumulating a negative charge.

References Cited

UNITED STATES PATENTS

| | | | |
|---|---|---|---|
| 2,646,534 | 7/1953 | Manley | 315—84.5 X |
| 2,814,762 | 11/1957 | Jackson et al. | 315—84.5 |

| | | | |
|---|---|---|---|
| 3,025,418 | 3/1962 | Brahm | 307—252 |
| 3,125,753 | 3/1964 | Jones | 340—52 X |
| 3,316,426 | 4/1967 | Imahashi | 307—225 X |
| 3,217,185 | 11/1965 | Jansons | 307—224 XR |
| 3,260,858 | 7/1966 | Kueber | 307—224 |

JOHN S. HEYMAN, Primary Examiner

S. D. MILLER, Assistant Examiner

U.S. Cl. X.R.

307—224; 328—37